United States Patent
Schmidt et al.

[19]

[11] Patent Number: 6,111,551

[45] Date of Patent: Aug. 29, 2000

[54] HOUSING WITH RADAR-ABSORBENT PROPERTIES

[75] Inventors: Ewald Schmidt, Ludwigsburg; Klaus Voigtlaender, Wangen; Egon Moosbrugger, Stuttgart; Bernhard Lucas, Mundelsheim; Georg Clauss, Waiblingen; Dirk Langenhan, Schwieberdingen, all of Germany

[73] Assignee: Robert Bosch GmbH, Stuttgart, Germany

[21] Appl. No.: 09/147,908

[22] PCT Filed: Nov. 28, 1997

[86] PCT No.: PCT/DE97/02789

§ 371 Date: Mar. 23, 1999

§ 102(e) Date: Mar. 23, 1999

[87] PCT Pub. No.: WO98/38697

PCT Pub. Date: Sep. 3, 1998

[30] Foreign Application Priority Data

Feb. 26, 1997 [DE] Germany .......................... 197 07 585

[51] Int. Cl.[7] .............................. G21F 1/10; H01Q 1/36; B32B 31/18
[52] U.S. Cl. ................... 343/872; 342/1; 342/4; 428/920; 523/136; 523/137; 156/254
[58] Field of Search ................. 343/872; 342/4, 342/1; 428/920; 523/136, 137; 156/254, 264

[56] References Cited

U.S. PATENT DOCUMENTS

| | | | |
|---|---|---|---|
| 4,538,151 | 8/1985 | Hatakeyama et al. | 343/18 A |
| 5,223,849 | 6/1993 | Kasevich et al. | 343/895 |
| 5,230,763 | 7/1993 | Roth et al. | 156/254 |
| 5,552,455 | 9/1996 | Schuler et al. | 523/137 |

FOREIGN PATENT DOCUMENTS

| | | |
|---|---|---|
| 0 394 207 A1 | 10/1990 | European Pat. Off. . |
| 0 685 340 A1 | 12/1995 | European Pat. Off. . |
| 21 51 349 | 8/1978 | Germany . |
| 31 31 137 C2 | 10/1985 | Germany . |
| 195 18 541 C2 | 12/1996 | Germany . |

*Primary Examiner*—Don Wong
*Assistant Examiner*—James Clinger
*Attorney, Agent, or Firm*—Michael J. Striker

[57] ABSTRACT

The invention relates to a housing (1) with radar-absorbent properties, in particular for a radar sensor in a motor vehicle, with electrically conductive particles whose dimensions are adapted to the frequency of the radar beams to be absorbed. The housing (1) comprises a material that as its basic component contains plastic, either unreinforced or reinforced with glass fibers, selectively mineral-filled, and contains as an additive steel fibers (2) in a mixture such that the specific conductivity σ of the housing adheres to a predetermined value.

8 Claims, 1 Drawing Sheet

HOUSING WITH RADAR-ABSORBENT PROPERTIES

BACKGROUND OF THE INVENTION

The invention relates to a housing with radar-absorbent properties.

For equipment that generates radar radiation in the microwave range, housings must be created that at least in some regions also have radar-absorbent properties. Typical metal or plastic housings must have a foil or film glued to them that has these radar-absorbent properties.

For instance, it is known from European Patent Disclosure 0 685 340 Al that for a radar-absorbent window lining, a plurality of absorbent layers have to be glued to the window glass; one layer is provided with electric conductor segments in the form of wires, which are arranged parallel to one another as a function of the polarization of the incident radar beams, and which are adapted in terms of their size and installed position to the frequency of the radar beams to be absorbed.

Affixing additional absorber layers to housings for radar technology is very labor-intensive, and for many housing forms can be done with difficulty if at all.

SUMMARY OF THE INVENTION

In accordance with the present invention, the housing with radar-absorbent properties comprises electrically conductive particles with dimensions adapted to a frequency of radar beams to be absorbed; and a housing part composed of a material which has plastic as a basic component, selectively a mineral filling, and steel fibers as an additive in a mixture such that a specific conductivity $\sigma$ of said housing parts meets the following condition:

$\sigma \approx \omega \epsilon_o \epsilon_r$, in which $\omega$ represents the circuit frequency of the radar beams, $\epsilon_o$ represents the dielectric coefficient of the material of said housing part, and $\epsilon_r$ represents the electric field constant.

The housing with radar-absorbent properties according to the invention is advantageous because a housing can be produced in a single operation, for instance by injection molding in which the reinforcement and the additive are mixed with the basic component, and the radar-absorbent properties are always assured.

In a preferred embodiment, a housing is made, preferably injection-molded, from a plastic with a reinforcement comprising at least up to 50 weight-% of glass fibers, a filler or outfitting with up to 50 weight-% of mineral fillers or a mixture thereof, and an additive comprising approximately 5 to 20 weight-% of steel fibers. Thus in a simple manner a radar-absorbent housing can be made that with respect to its conductivity $\sigma$ meets the following physical condition:

$\sigma \approx \omega \epsilon_o \epsilon_r$, in which $\omega$ represents the circuit frequency of the radar beams, $\epsilon_o$ represents the dielectric coefficient of the housing material, and $\epsilon_r$ represents the electric field constant.

For example, at a frequency of over 10 GHz of the radar beams to be absorbed, a homogeneous conductivity of approximately 10 S/m is attainable, and the glass fibers in the plastic have a length of approximately 2 to 20 mm.

In another advantageous embodiment of the invention, the housing is also metallized on the outside, for instance chemically, galvanically, by vapor deposition or by sputtering.

BRIEF DESCRIPTION OF THE DRAWING

An exemplary embodiment of a housing according to the invention will be described in conjunction with the drawing. Shown are.

DESCRIPTION OF THE PREFERRED EMBODIMENT

Figure 1:
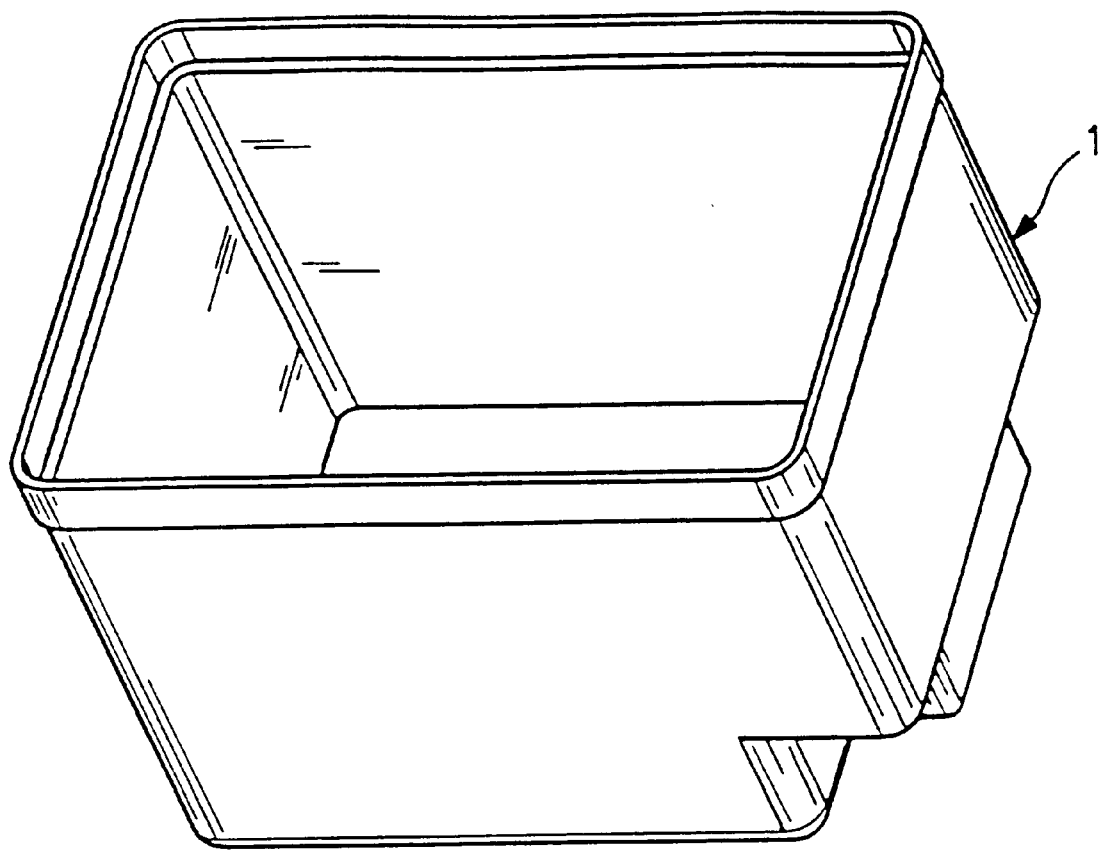
FIG. 1, a perspective view of a housing for a radar sensor in automotive engineering, and FIG. 2, a basic illustration of a steel fiber filler in the housing material.

In FIG. 1, a perspective view of a housing 1 for a radar sensor, not visible here, is shown. Such a radar sensor is a component of an ACC (Adaptive Cruise Control) vehicle security system, for instance, in which information on the distance from and relative speed with respect to other vehicles and on road conditions is continually processed. For example, in a manner known per se, FMCW (frequency modulated continuous wave) radar is mounted on the front of the outside of the vehicle and has an oscillator, a mixer, an amplifier, and an antenna system for generating the radar beams, as well as a receiver with evaluation electronics.

Figure 2:
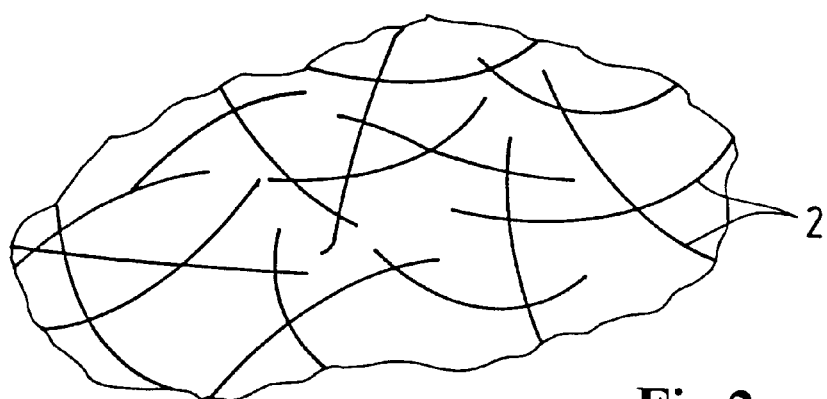

In the housing part shown in FIG. 1, in whose opening the antenna system is installed and which thus broadcasts toward the front, the plastic mixtures mentioned in the background section are provided for the sake of achieving adequate rearward absorption of the radar beams. FIG. 2, to show clearly the location of the steel fibers as an additive to the basic component, the latter comprising plastic in the form of PA6, PA66 or PBT, shows a number of steel fibers 2 in an enlarged view. In the exemplary embodiment, these steel fibers have a length of approximately 2 to 20 mm. The aforementioned plastic PA 6 (polyamide 6) comprises two monomers, while the plastic PBT is polybutyleneterephthalate.

What is claimed is:

1. A housing with radar-absorbent properties, electrically conductive particles with dimensions adapted to a frequency of radar beams to be absorbed; and a housing part composed of a material which has plastic as a basic component, selectively a mineral filling, and steel fibers as an additive in a mixture such that a specific conductivity $\sigma$ of said housing parts meets the following condition:

$\sigma \approx \omega \epsilon_o \epsilon_r$, in which $\omega$ represents the circuit frequency of the radar beams, $\epsilon_o$ represents the dielectric coefficient of the material of said housing part, and $\epsilon_r$ represents the electric field constant.

2. A housing as defined in claim 1, wherein said material of said housing further contains reinforcing glass fibers.

3. A housing as defined in claim 1, wherein said housing part has a homogenous conductivity of substantially 10 S/m above a frequency of 10 GHz of the radar beams to be absorbed.

4. A housing as defined in claim 2, wherein said glass fibers and/or said mineral filling constitute substantially 0–50 weight percent of said material of said housing part, and said steel fibers of said additive constitute substantially 5–20 weight percent of said material of said housing part.

5. A housing as defined in claim 1, wherein said plastic of said basic component of said housing part is a polyamide selected from the group consisting of polyamide 6 and polyamide 66.

6. A housing as defined in claim 1, wherein said plastic of said basic component of said housing part is polybutyleneterephthalate.

7. A housing as defined in claim 1, wherein said steel fibers of said reinforcement have a length of substantially 2–20 mm.

8. A housing as defined in claim 1; and further comprising a metal layer applied on an outer side of said housing part and selected from the group consisting of a galvanically applied metal layer, a chemically applied metal layer, a vapor deposition applied metal layer and a sputtering applied metal layer.

\* \* \* \* \*